(12) United States Patent
Kim

(10) Patent No.: US 11,855,110 B2
(45) Date of Patent: Dec. 26, 2023

(54) FINGERPRINT SENSOR, METHOD FOR MANUFACTURING FINGERPRINT SENSOR, AND DISPLAY DEVICE INCLUDING FINGERPRINT SENSOR

(71) Applicant: SAMSUNG DISPLAY CO., LTD., Yongin-si (KR)

(72) Inventor: Si Kwang Kim, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 186 days.

(21) Appl. No.: 17/409,948

(22) Filed: Aug. 24, 2021

(65) Prior Publication Data

US 2022/0123036 A1    Apr. 21, 2022

(30) Foreign Application Priority Data

Oct. 21, 2020 (KR) ........................ 10-2020-0136675

(51) Int. Cl.
*H01L 27/146* (2006.01)
*H01L 25/18* (2023.01)
*G06V 40/13* (2022.01)

(52) U.S. Cl.
CPC .... *H01L 27/14623* (2013.01); *G06V 40/1318* (2022.01); *H01L 25/18* (2013.01); *H01L 27/14685* (2013.01)

(58) Field of Classification Search
CPC .............. H01L 25/18; H01L 27/14623; H01L 27/14678; H01L 27/14685; G06V 40/13; G06V 40/1318; H10K 59/65
See application file for complete search history.

(56) References Cited

U.S. PATENT DOCUMENTS

| 2020/0266305 | A1* | 8/2020 | Lee ................. H01L 31/02164 |
| 2022/0043995 | A1 | 2/2022 | Song et al. |

FOREIGN PATENT DOCUMENTS

| CN | 110569686 B | * | 8/2022 | ........... G06K 9/0004 |
| KR | 10-2022-0019123 | | 2/2022 | |
| KR | 10-2022-0041288 | | 4/2022 | |

* cited by examiner

*Primary Examiner* — Nelson Garces
(74) *Attorney, Agent, or Firm* — F. Chau & Associates, LLC

(57) ABSTRACT

A fingerprint sensor includes: a light sensing layer including a light sensing element; and an optical layer including a plurality of light transmitting areas, a light blocking area, a light transmitting member disposed in the plurality of light transmitting areas, a light blocking member disposed in the light blocking area, and a planarization member disposed on the light blocking member, wherein the light blocking area surrounds the plurality of light transmitting areas, wherein the light transmitting member includes a first organic material, wherein the light blocking member includes a second organic material, and wherein the planarization member includes a third organic material and a positive-type photosensitive material.

15 Claims, 16 Drawing Sheets

OA: OA$_n$

OA: OAn

FINGERPRINT SENSOR, METHOD FOR MANUFACTURING FINGERPRINT SENSOR, AND DISPLAY DEVICE INCLUDING FINGERPRINT SENSOR

CROSS-REFERENCE TO RELATED APPLICATION

This application claims priority under 35 U.S.C. § 119 to Korean Patent Application No. 10-2020-0136675 filed on Oct. 21, 2020 in the Korean Intellectual Property Office, the disclosure of which is incorporated by reference herein in its entirety.

TECHNICAL FIELD

The present invention relates to a fingerprint sensor, a method of manufacturing the fingerprint sensor, and a display device including the fingerprint sensor.

DISCUSSION OF THE RELATED ART

Display devices are incorporated into various electronic appliances such as smart phones, tablets, notebook computers, monitors, TVs and the like. Recently, with the development of mobile communication technology, the use of portable electronic appliances such as smart phones, tablets, notebook computers and the like has greatly increased.

Generally, a portable electronic appliance may store privacy information such as contact information, call history, messages, photographs, memos, user's web browsing information, location information, financial information and biometric information. To protect personal information stored on a portable electronic appliance, fingerprint authentication may be used to authenticate a fingerprint, which is a user's biometric information, and gain access to the personal information upon matching authentication. In this case, a display device may include a fingerprint sensor for fingerprint authentication. For example, the fingerprint sensor may be implemented using an optical method, an ultrasonic method, or a capacitive method. For example, the optical fingerprint sensor may typically include a collimator having a light sensing unit for sensing light, an opening for providing light to the light sensing unit, and a light blocking unit for blocking light.

In addition, when a fingerprint sensor is disposed in a bezel area or non-display area of a display device, there may be a limitation in widening the display area of the display device. Therefore, a fingerprint sensor may be disposed in the display area of the display device.

SUMMARY

According to an embodiment of the present invention, a fingerprint sensor includes: a light sensing layer including a light sensing element; and an optical layer including a plurality of light transmitting areas, a light blocking area, a light transmitting member disposed in the plurality of light transmitting areas, a light blocking member disposed in the light blocking area, and a planarization member disposed on the light blocking member, wherein the light blocking area surrounds the plurality of light transmitting areas, wherein the light transmitting member includes a first organic material, wherein the light blocking member includes a second organic material, and wherein the planarization member includes a third organic material and a positive-type photosensitive material.

In an embodiment of the present invention, the planarization member overlaps the light blocking member in a thickness direction, and exposes a portion of the light blocking member, In an embodiment of the present invention, the portion of the light blocking member exposed by the planarization member is disposed between the light transmitting member and the planarization member.

In an embodiment of the present invention, the light blocking member at least partially surrounds the light transmitting member.

In an embodiment of the present invention, the light blocking member further includes a recess, and the planarization member is disposed on the recess.

In an embodiment of the present invention, the planarization member exposes a portion of the light blocking member, and a first surface of the planarization member and a first surface of the portion of the light blocking member exposed by the planarization member are located at the same first height with respect to a first surface of the light sensing layer.

In an embodiment of the present invention, a first surface of the light transmitting member is located at a second height higher than the first height with respect to the first surface of the light sensing layer.

In an embodiment of the present invention, light transmittance of the light transmitting member is greater than light transmittance of the planarization member, and light transmittance of the planarization member is greater than light transmittance of the light blocking member.

In an embodiment of the present invention, the light transmittance of the light transmitting member is in a range between about 90% and about 100%, wherein the light transmittance of the planarization member is in a range between about 50% and about 70%, and wherein the light transmittance of the light blocking member is in a range between about 0% and about 10%.

In an embodiment of the present invention, the light blocking member further includes a black pigment or dye.

According to an embodiment of the present invention, a display device includes: a display panel; and a fingerprint sensor disposed on the display panel, wherein the fingerprint sensor includes: a light sensing layer including a light sensing element; and an optical layer including a plurality of light transmitting areas, a light blocking area, a light transmitting member disposed in the plurality of light transmitting areas, a light blocking member disposed in the light blocking area, and a planarization member disposed on the light blocking member, wherein the light blocking area surrounds the plurality of light transmitting areas, wherein light transmittance of the light transmitting member is greater than light transmittance of the planarization member, and light transmittance of the planarization member is greater than light transmittance of the light blocking member, and wherein the planarization member overlaps the light blocking member in a thickness direction, and exposes a portion of the light blocking member.

In an embodiment of the present invention, the portion of the light blocking member exposed by the planarization member is disposed between the light transmitting member and the planarization member, and surrounds the light transmitting member.

In an embodiment of the present invention, a first surface of the planarization member and a first surface of the portion of the light blocking member exposed by the planarization member are located at the same height with respect to a first surface of the light sensing layer.

In an embodiment of the present invention, the light transmitting member includes a first organic material, wherein the light blocking member includes a second organic material, and wherein the planarization member includes a third organic material and a positive-type photosensitive material.

In an embodiment of the present invention, the light blocking member includes a recess, and the planarization member is disposed on the recess.

According to an embodiment of the present invention, a method of manufacturing a fingerprint sensor includes: forming a first organic material layer on a light sensing layer; patterning the first organic material layer using an etching mask to form a light transmitting member; forming a second organic material layer on the light transmitting member; forming a third organic material layer on the second organic material layer and including a positive-type photosensitive material; and etching the second organic material layer and the third organic material layer to form a light blocking member and a planarization member, wherein the light transmitting member is disposed in each of a plurality of light transmitting areas spaced apart from each other, wherein the light blocking member is disposed in a light blocking area surrounding the plurality of light transmitting areas, and wherein the planarization member is disposed on the light blocking member.

In an embodiment of the present invention, the etching of the second organic material layer and the third organic material layer is performed by dry etching.

In an embodiment of the present invention, the method further includes removing the etching mask after etching the second organic material layer and the third organic material layer, wherein the removing of the etching mask is performed by wet etching.

In an embodiment of the present invention, the method further includes exposing and developing the third organic material layer after forming the second organic material layer and the third organic material layer.

In an embodiment of the present invention, the light blocking member includes a recess, and the planarization member is disposed on the recess.

BRIEF DESCRIPTION OF THE DRAWINGS

The above and other features of the present invention will become more apparent by describing in detail embodiments thereof with reference to the attached drawings, in which.

DETAILED DESCRIPTION OF THE EMBODIMENTS

Figure 1:
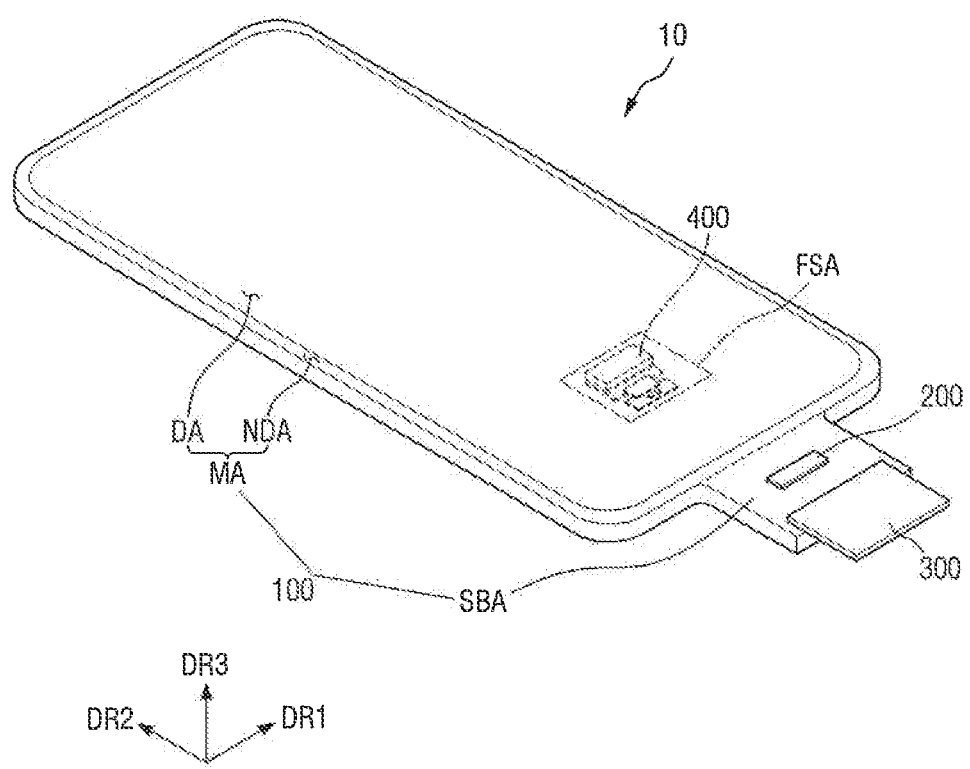
FIG. 1 is a perspective view of a display device according to an embodiment of the present invention.

The present invention will now be described more fully hereinafter with reference to the accompanying drawings. This invention may, however, be embodied in different forms and should not be construed as limited to the embodiments set forth herein.

It will also be understood that when a layer is referred to as being "on" another layer or substrate, it can be directly on the other layer or substrate, or intervening layers may also be present. The same reference numbers indicate the same components throughout the specification, and thus, repetitive descriptions may be omitted. In the attached figures, the thickness of layers and regions is exaggerated for clarity. In other words, since sizes and thicknesses of components in the drawings may be exaggerated for clarity, the following embodiments of the present invention are not limited thereto.

Although the terms "first", "second", etc. may be used herein to describe various elements, these elements, should not be limited by these terms. These terms may be used to distinguish one element from another element. For example, a first element discussed below may be termed a second element without departing from the spirit and scope of the present invention. The description of an element as a "first" element may not require or imply the presence of a second element or other elements. The terms "first", "second", etc. may also be used herein to differentiate different categories or sets of elements. For example, for conciseness, the terms "first", "second", etc. may represent "first-category (or first-set)", "second-category (or second-set)", etc., respectively.

Hereinafter, embodiments of the present invention will be described with reference to the attached drawings.

FIG. 1 is a perspective view of a display device according to an embodiment of the present invention.

Referring to FIG. 1, a display device 10, which is a device for displaying a moving image or a still image, may be used as a display screen of various products such as televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs (UMPCs).

The display device 10 includes a display panel 100, a display driving circuit 200, a circuit board 300, and a fingerprint sensor 400.

The display panel 100 may be a light-emitting display panel such as an organic light-emitting display panel using an organic light-emitting diode, a quantum dot light-emitting display panel including a quantum dot light-emitting layer, an inorganic light-emitting display panel including an inorganic semiconductor, or a micro light-emitting display panel using a micro light-emitting diode (LED). Hereinafter, the display panel 10 will be mainly described as an organic light emitting display panel, but the present invention is not limited thereto. For example, in an embodiment of the present invention, as the display panel 10, other types of display panels such as a liquid crystal display panel, a quantum dot liquid crystal display panel, a quantum nano light-emitting display panel (nano NED), and a micro LED may be applied.

The display panel 100 may include a display area DA, in Which an image is displayed, and a non-display area NDA, in which no image is displayed. The non-display area NDA may be disposed to at least partially surround the display area DA. The non-display area NDA may form a bezel.

The display area DA may have a polygonal shape. For example, the display area DA may have a rectangular shape having right-angled corners or rounded corners on the plane. However, the planar shape of the display area DA is not limited to a rectangular shape, and for example, may be formed in a circular shape, an elliptical shape, and other various shapes.

In the drawings, for example, short sides of the rectangle of the display area DA extend in the first direction DR1 and long sides thereof extend in the second direction DR2 perpendicular to the first direction DR1. The third direction DR3 is a direction substantially perpendicular to the first direction DR1 and the second direction DR2 and may be substantially the same as the thickness direction of the display device 10.

The display area DA may include a plurality of pixels. The pixels may be arranged in a matrix shape, Each of the pixels may include a light-emitting layer and a circuit layer controlling the amount of light emitted from the light-emitting layer. The circuit layer may include, for example, a wiring, an electrode, and at least one transistor. The light-emitting layer may include an organic light-emitting material. For example, the light-emitting layer may be sealed by an encapsulation film.

The display area DA may include a fingerprint sensing area FSA. The fingerprint sensing area FSA may be disposed in the display area DA. A user's fingerprint may be sensed in the fingerprint sensing area FSA. The fingerprint sensor 400 for sensing the user's fingerprint may be disposed in the fingerprint sensing area FSA. The fingerprint sensing area FSA may be located in a part of the display area DA, but the present invention is not limited thereto. For example, the fingerprint sensing area FSA may be substantially the same as the display area DA and may overlap the entire display area DA.

For example, the non-display area NDA may surround all sides of the display area DA, and may form a frame of the display area DA. However, the present invention is not limited thereto.

The display panel 100 may be flexible such that it can be, for example, warped, curved, bent, folded, or rolled. However, the present invention is not limited thereto.

The display panel 100 may include a main area MA and a sub-area SBA.

A display area DA, a non-display area NDA, and a fingerprint sensing area FSA may be located in the main area MA. For example, the main area MA may have a shape similar to the planar shape of the display device 1. For example, the main area MA may be a flat area located on one plane. However, the present invention is not limited thereto, and for example, at least one of the edges other than the edges (sides) connected to a bending area in the main area MA may be bent to form a curved surface or may be bent in a vertical direction.

The sub-area SBA may protrude in the second direction DR2 from one side of the main area MA. The length of the sub-area SBA in the first direction DR1 may be smaller than the length of the main area MA the first direction DR1, and the length of the sub-area SBA in the second direction DR2 may be smaller than the length of the main area MA in the second direction DR2, but the present invention is not limited thereto.

Although it is illustrated in the drawings that the sub-area SBA is unfolded, the sub-area SBA may be bent. For example, the sub-area SBA may be bent with a curvature in a direction opposite to the display surface to, for example, overlap the lower surface of the main area MA. In this case, the surface of the sub-area SBA is reversed, and at least a part of the sub-area SBA may be disposed on the lower surface of the display panel 100, For example, when the sub-area SBA is bent, the sub-area SBA may overlap the main area MA in the thickness direction. The display driving circuit 200 may be disposed in the sub-area SBA.

The display driving circuit 200 may generate signals and voltages for driving the display panel 100. The display driving circuit 200 may be formed as an integrated circuit (IC), and attached onto the display panel 100 by, for example, a chip on glass (COG) method, a chip on plastic (COP) method, or an ultrasonic bonding method, but the present invention is not limited thereto. For example, the display driving circuit 200 may be attached onto the circuit board 300 in a chip on film (COF) method.

The circuit board 300 may be attached to one end of the sub-area SBA of the display panel 100 by using an anisotropic conductive film or ultrasonic bonding, Through this, the circuit board 300 may be electrically connected to the display panel 100 and the display driving circuit 200. The display panel 100 and the display driving circuit 200 may receive digital video data, timing signals, and driving voltages through the circuit board 300. For example, the circuit board 300 may be a flexible printed circuit board, a printed circuit board, or a flexible film such as a chip on film.

The fingerprint sensor 400 may be disposed on the lower surface of the display panel 100. The fingerprint sensor 400 may be disposed within the display area DA. For example, the fingerprint sensor 400 may be disposed in the fingerprint sensing area FSA disposed in the display area DA. The fingerprint sensor 400 may be attached to the lower surface of the display panel 100 using an adhesive member (STM, refer to FIG. 4).

Figure 2:
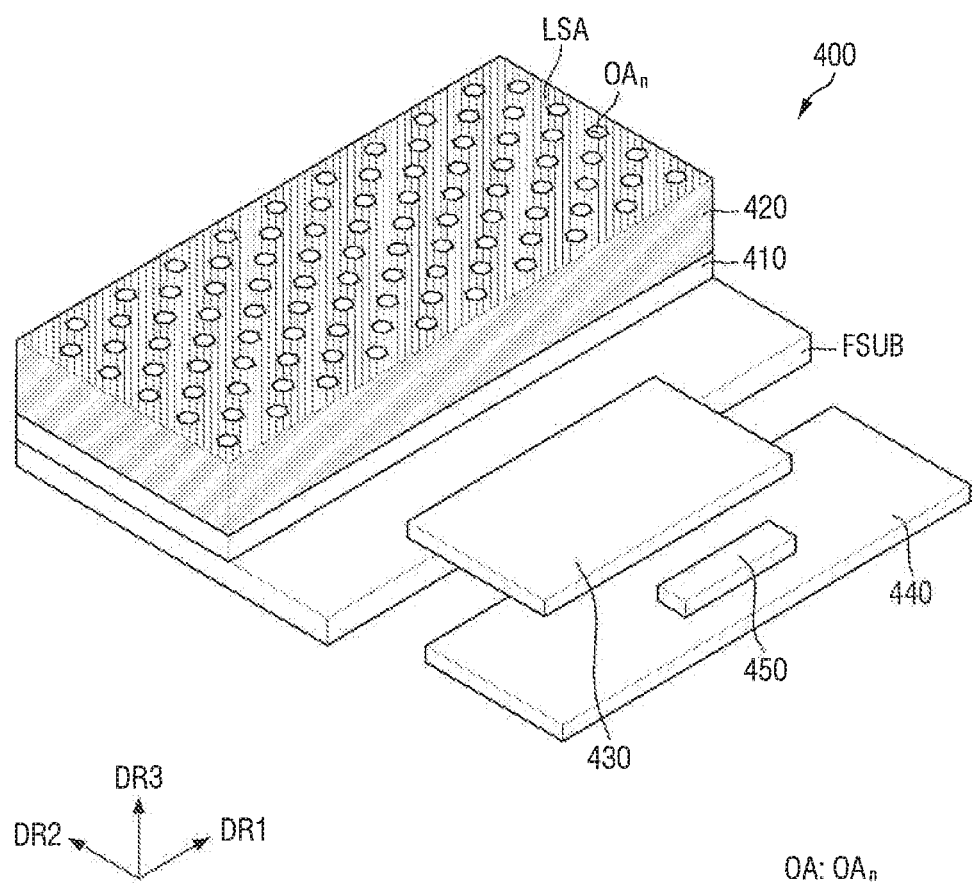
FIG. 2 is a perspective view of a fingerprint sensor according to an embodiment of the present invention.

FIG. 2 is a perspective view of a fingerprint sensor according to an embodiment of the present invention.

Referring to FIG. 2, the fingerprint sensor 400 may include a fingerprint sensor substrate FSUB, a light sensing layer 410, an optical layer 420, a flexible film 430, a sensor circuit board 440, and a sensor driving circuit 450.

Components may be disposed on the fingerprint sensor substrate FSUB. For example, the fingerprint sensor substrate FSUB may support components disposed thereon. For example, the fingerprint sensor substrate FSUB may include an insulating material such as glass or polymer resin. For example, the fingerprint sensor substrate FSUB may include polyimide. The fingerprint sensor substrates FSUB may be a flexible substrate capable of bending, folding, rolling, or the like.

The light sensing layer 410 may be disposed on the fingerprint sensor substrate FSUB. The light sensing layer 410 may include a plurality of sensor pixels SP (refer to FIG. 3) arranged in the first direction DR1 and the second direction DR2. Each of the sensor pixels SP (refer to FIG. 3) may include a light sensing element through which a sensing current flows according to incident light and at least one transistor connected to the light sensing element. The light sensing element may include a photo diode or a photo transistor.

The optical layer 420 may be disposed on the light sensing layer 410. An infrared filter layer may be disposed on the optical layer 420, or an infrared filter layer may be disposed between the optical layer 420 and the light sensing layer 410.

The optical layer 420 may include a first area and a second area having different light transmittances from each other. The light transmittance of the first area may be greater than that of the second area. In an embodiment of the present invention, the first area (hereinafter, referred to as a light transmitting area OA) may be a light transmitting area OA that transmits light, and the second area (hereinafter, referred to as a light blocking area LSA) may be a light blocking area LSA that blocks light. Hereinafter, a case where the light transmitting area OA and the light blocking area LSA are applied to the first area and the second area having different light transmittances from each other, respectively, is shown as an example, but the embodiment is not limited thereto. For example, both the first area and the second area may be light transmitting areas through which incident light is transmitted by about 50% or more, but the light transmittance of the second area is lower than that of the first area by about 10% or less.

The light transmitting area OA may be divided into a plurality of unit light transmitting areas OAn by the light blocking area LSA. The respective unit light transmitting areas OAn may be separated and spaced apart from each other. Each of the unit light transmitting areas OAn may have a hexagonal shape in a plan view, but the shape thereof is not limited thereto. For example, each of the unit light transmitting areas OAn may have a shape of a rectangle, a square, or a pentagon, or may have a shape such as a circle or an ellipse. The size of each of the unit light transmitting areas OAn and the interval between the unit light transmitting areas OAn may be substantially uniform.

The unit light transmitting areas OAn may be disposed to be spaced apart from each other with the light blocking area LSA interposed therebetween. The light blocking area LSA may surround each of the unit light transmitting areas OAn on the plane. In addition, the light blocking area LSA may be integrally connected between the plurality of unit light transmitting areas OAn. Details of the light transmitting area OA and the light blocking area LSA will be described later.

One side of the flexible film 430 may be disposed on a portion of the fingerprint sensor substrate FSUB that is not covered by the light sensing layer 410. The flexible film 430 may be attached to one end of the fingerprint sensor substrate FSUB by, for example, using an anisotropic conductive film or ultrasonic bonding. The flexible film 430 may be electrically connected to a fingerprint pad of the fingerprint sensor substrate HUB. The flexible film 430 may be a flexible printed circuit board, a printed circuit board, or a flexible film such as a chip on film.

The other side of the flexible film 430 may be disposed on the sensor circuit board 440. The other side of the flexible film 430 may be attached to the sensor circuit board 440 through a conductive adhesive member such as an anisotropic conductive film. Thus, the flexible film 430 may be electrically connected to the sensor circuit board 440. Although the present invention is not limited thereto, the flexible film 430 may be connected to the sensor circuit board 440 in the form of a chip on film. The sensor circuit board 440 may be a flexible printed circuit board or a printed circuit board.

The sensor driving circuit 450 may be disposed on the sensor circuit board 440. However, the present invention is not limited thereto, and for example, the sensor driving circuit 450 may be disposed on the flexible film 430. The sensor driving circuit 450 may receive sensing voltages of the sensor pixels SP (refer to FIG. 3) of the light sensing layer 410 through the flexible film 430 and the sensor circuit board 440. Accordingly, the sensor driving circuit 450 may recognize the fingerprint pattern of a finger according to the sensing voltages of each of the sensor pixels SP.

Figure 3:
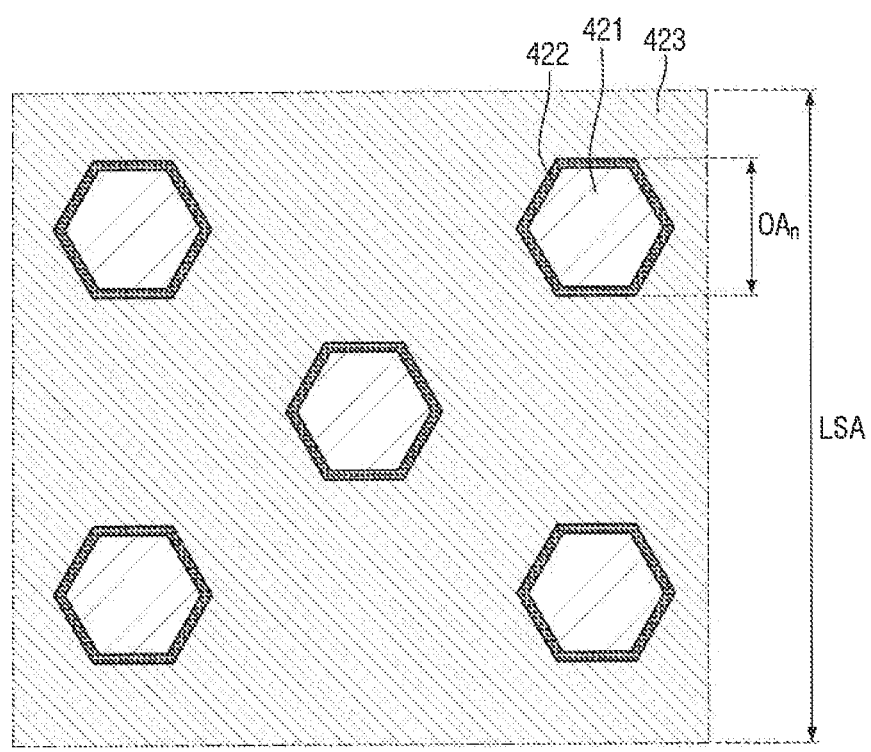
FIG. 3 is a plan view of a fingerprint sensor according to an embodiment of the present invention.
Figure 3:
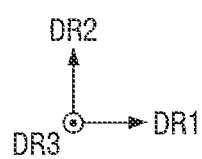
Figure 4:
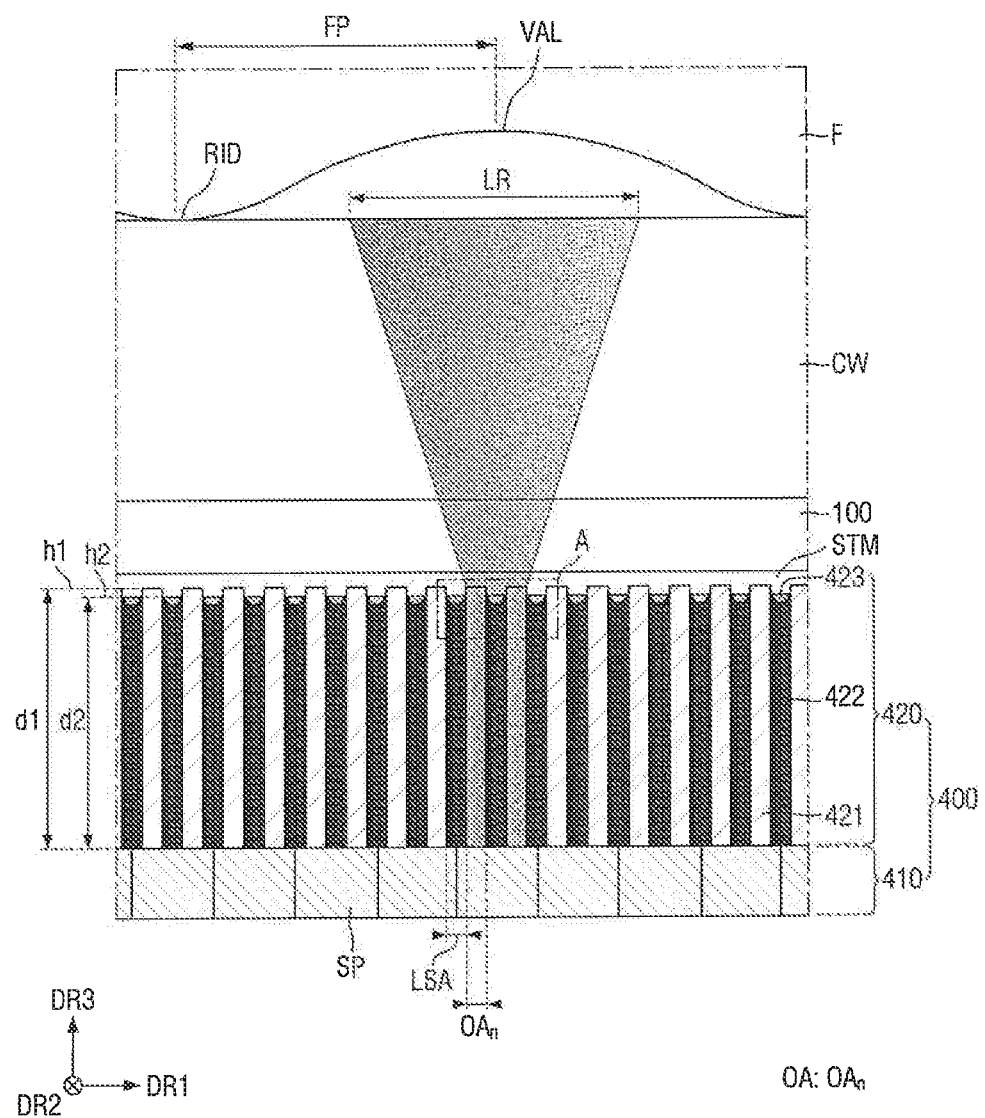
FIG. 4 is a cross-sectional view of a display device according to an embodiment of the present invention.
Figure 5:
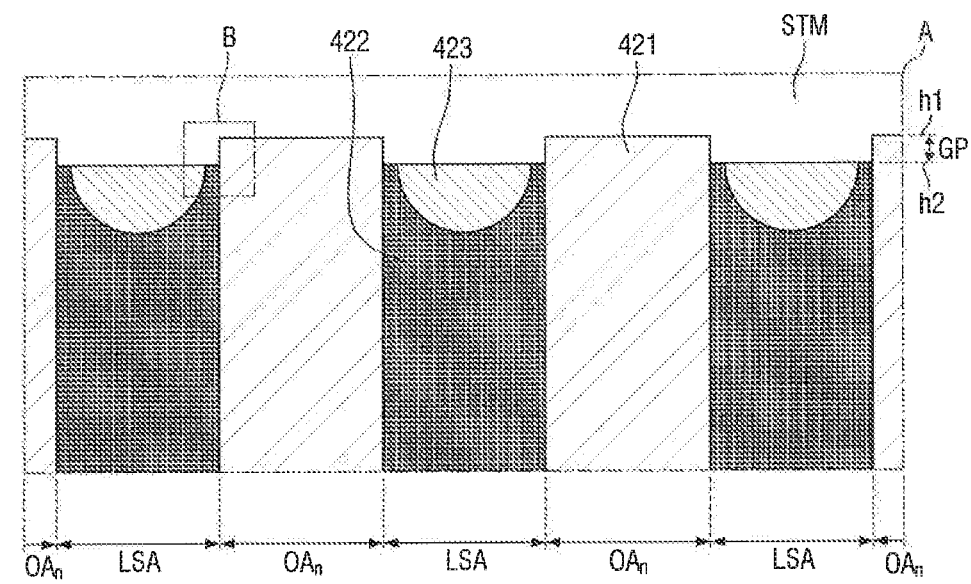
FIG. 5 is an enlarged view of the area A of PG. 4.
Figure 5:
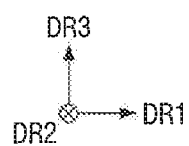
Figure 6:
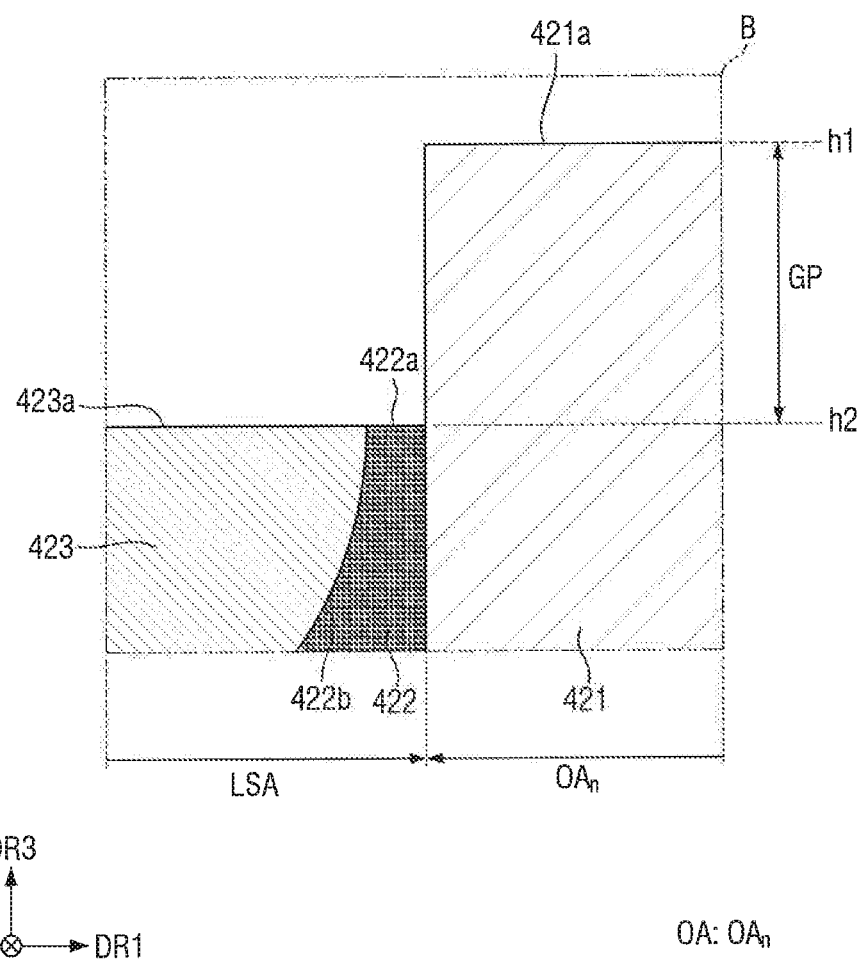
FIG. 6 is an enlarged view of the area B of FIG. 5.

FIG. 3 is a plan view of a fingerprint sensor according to an embodiment of the present invention. FIG. 4 is a cross-sectional view of a display device according to an embodiment of the present invention. FIG. 5 is an enlarged view of the area A of FIG. 4. FIG. 6 is an enlarged view of the area B of FIG. 5. FIG. 3 illustrates an enlarged view of a part of the plane of the optical layer 420 of the fingerprint sensor 400. FIG. 4 illustrates a partial cross-sectional view of the display panel 100 and the fingerprint sensor 400. It is illustrated in FIG. 4 that a user's finger F touches the display device 10 for fingerprint recognition.

Referring to FIGS. 3 to 6, the display device 10 may further include a cover window CW disposed on the upper surface of the display panel 100 and an adhesive member STM for attaching the display panel 100 and the fingerprint sensor 400 to each other. The cover window CW may be disposed on the display panel 100 to cover the upper surface of the display panel 100. The cover window CW may serve to protect the display panel 100 and lower members. For example, the cover window CW may be attached to the upper surface of the display panel 100 using a transparent adhesive member.

The cover window CW may be made of a transparent material, and may be glass or plastic. For example, when the cover window CW is glass, it may be an ultra thin glass (UTG) having a thickness of about 0.1 mm or less. When the cover window CW is made of plastic, it may include a transparent polyimide film.

The adhesive member STM may be interposed between the fingerprint sensor 400 and the display panel 100, and may attach the fingerprint sensor 400 and the display panel 100 to each other. The adhesive member STM may be optically transparent. Although not limited thereto, the adhesive member STM may be, for example, a transparent adhesive film such as an optically clear adhesive (OCA) film or a transparent adhesive resin such as an optically clear resin (OCR).

The adhesive member STM may compensate for a step between the light transmitting area OA and light blocking area LSA of the optical layer 420. For example, as will be described later, a step GP may be provided between one surface 421a of a light transmitting member 421 disposed in the light transmitting area OA and one surface 422a of a light blocking member 422 disposed in the light blocking area LSA and between one surface 421a of a light transmitting member 421 disposed in the light transmitting area OA and one surface 423a of a sub-light blocking member 423. Even when the step GP is provided, the adhesive member STM may be interposed between the fingerprint sensor 400 and the display panel 100 to compensate for the step GP. Accordingly, the fingerprint sensor 400 and the display panel 100 may be attached to each other.

The light sensing layer 410 may recognize a fingerprint by recognizing light incident through the optical layer 420. Although not shown, the light sensing layer 410 may include a light sensing element and at least one transistor. Although not limited thereto, for example, each of the sensor pixels SP of the light sensing layer 410 may include a light sensing element and at least one transistor. The light sensing element may convert light energy into electrical energy, and may have photovoltaic power in Which a current flowing according to the intensity of light changes. For example, the light sensing element may be a photodiode. When a driving signal is supplied, the transistor of the light sensing layer 410 may be turned on to transmit a current flowing through the light sensing element. Based on the current converted by the light sensing element and transmitted by the transistor of the light sensing layer 410, a fingerprint may be detected.

For example, each of the sensor pixels SP of the light sensing layer 410 may overlap at least one unit light transmitting area OAn in the thickness direction (third direction DR3), For example, each of the sensor pixels SP may overlap at least one light transmitting member 421. Although it is shown in the drawing that one sensor pixel SP overlaps two unit light transmitting areas OAn in the thickness direction (e.g., the third direction DR3), the number of unit light transmitting areas OAn overlapping the sensor pixel SP in the thickness direction (the third direction DR3) is not limited thereto. For example, the number of unit light transmitting areas OA overlapping one sensor pixel SP may be in the range of about 100 to about 1000, or may be in the range of about 10 to about 10000. For example, the sensor pixel SP may overlap one unit light transmitting area OAn in the thickness direction (third direction DR3).

The fingerprint of the finger F may be shaped by protruding ridge RID and valleys VAL depressed therefrom. When the finger F touches the cover window CW, the ridge RID of the fingerprint directly contacts the cover window CW, and the valley VAL may be spaced from the cover window CW by a predetermined distance. Light traveling toward the finger F may be reflected from each of the ridge RID and valley VAL of the finger F to be directed toward the light sensing layer 410. The light traveling toward the finger F may be light emitted from the display panel 100, but the present invention is not limited thereto.

In this case, the light reflected from the ridge RID and valley VAL of the finger F may have different optical characteristics from each other. For example, the light reflected from the ridge RID and the light reflected from the valley VAL may have different frequencies, wavelengths, and intensities from each other. Accordingly, each sensor pixel SP of the light sensing layer 410 may output sensing signals having different electrical characteristics corresponding to the optical characteristics of light reflected from each of the ridge RID and the valley VAL. The sensing signals output by each sensor pixel SP may be converted into image data, and thus a user's fingerprint may be identified.

The light transmitting area OA of the optical layer 420 may be a path through which light reflected from the ridge RID and valley VAL of the finger F is incident. For example, when the user's finger F is in contact with the cover window CW, the light reflected from the finger F may be incident on the sensor pixel SP of the sensing layer 410 through the display panel 100 and the light transmitting area OA of the optical layer 420.

The light blocking area LSA of the optical layer 420 may block a part of light incident on the light sensing layer 410. The light blocking area LSA may control the range LR of the light incident on the sensor pixel SP through the light transmitting area OA. For example, in the light blocking area LSA, each sensor pixel PS of the light sensing layer 410 may allow the light reflected in the specific range LR to reach the light sensing layer 410, and the incident light reflected from an area other than the range LR may be blocked.

The range LR of light incident on the sensor pixel SP through the light transmitting area OA of the optical layer 420 may be shorter than the distance FP between the ridge RID and valley VAL of the fingerprint of the finger F. The distance FP between the ridge RID and valley VAL of the fingerprint of the finger F may be about 500 µm. Accordingly, each sensor pixel SP may distinguish the light reflected from the ridge RID and/or valley VAL of the fingerprint of the finger F.

The optical layer 420 may further include a light transmitting member 421, a light blocking member 422, and a planarization member 423. The light transmitting member 421 may be disposed in the light transmitting area OA, and the light blocking member 422 and the planarization member 423 may be disposed in the light blocking area LSA.

The light transmitting member 421, the light blocking member 422, and the planarization member 423 may be disposed on the light sensing layer 410. For example, the light transmitting member 421, the light blocking member 422, and the planarization member 423 may be directly disposed on the light sensing layer 410. However, the present invention is not limited thereto, and for example, the optical layer 420 may further include a base substrate between the light sensing layer 410 and the light transmitting member 421, the light blocking member 422, and the planarization member 423, and in this case, for example, the light transmitting member 421, the light blocking member 422, and the planarization member 423 may be disposed on the base substrate.

A plurality of the light transmitting members 421 may be provided, and the plurality of light transmitting members 421 may be separated and spaced apart from each other. For example, each light transmitting member 421 may have an island shape in a plan view. For example, each light transmitting member 421 may have a polygonal shape. The light blocking member 422 may be disposed between the plurality of light transmitting members 421 and may fill a space between the light transmitting members 421 adjacent to each other. The planarization member 423 may be disposed on the light blocking member 422. The planarization member 423 may overlap the light blocking member 422 in the thickness direction (e.g., the third direction DR3), and may cover at least a part of the light blocking member 422. The planarization member 423 may be disposed on the light blocking member 422.

The light transmitting member 421, the light blocking member 422, and the planarization member 423 may include one (e.g., first) surfaces 421*a*, 422*a*, and 423*a*, respectively. The first surfaces 421*a*, 422*a*, and 423*a* may refer to upper surfaces of the light transmitting member 421, the light blocking member 422, and the planarization member 423, respectively. When the fingerprint sensor 400 is located under the display panel 100, the first surfaces 421*a*, 422*a*, and 423*a* of the light transmitting member 421, the light blocking member 422, and the planarization member 423 may face the display panel 100.

The light blocking member 422 may be integrally formed, but the present invention is not limited thereto. The light blocking member 422 may fill the space between the light transmitting members 421. For example, the light transmitting members 421 may be separated by the light blocking member 422. The light blocking member 422 may include a recess 422*b*. For example, the light blocking member 422 may provide a recess 422*b*. The recess 422*b* may be connected to the first surface 422*a* of the light blocking member 422. For example, the recess 422*b* may have a concave shape toward the lower portion of the optical layer 420. For example, the depth of the recess 422*b* with respect to the first surface 422*a* of the light blocking member 422 may decrease toward the light transmitting member 421, and may increase toward the vicinity of a center between the light transmitting members 421 adjacent to each other, but the present invention is not limited thereto. For example, the depth of the recess 422b may be the greatest at a region of the light blocking member 422, that is between adjacent light transmitting members 421.

The planarization member 423 may be disposed on the light blocking member 422, and may expose a part of the light blocking member 422, but the present invention is not limited thereto. The planarization member 423 may be located on the recess 422b of the light blocking member 422, and in this case, the planarization member 423 may expose the first surface 422a of the light blocking member 422. The planarization member 423 may be integrally formed, but the present invention is not limited thereto. For example, the thickness of the planarization member 423 may decrease toward the light transmitting member 421, and may increase toward the vicinity of a center between the adjacent light transmitting members 421, but the present invention is not limited thereto, the first surface 422a of the light blocking member 422 may be exposed by the planarization member 423. The first surface 422a of the light blocking member 422 exposed by the planarization member 423 and the first surface 423a of the planarization member 423 may be located at substantially the same height (for example, second height h2). For example, the first surface 422a of the light blocking member 422 and the first surface 423a of the planarization member 423 may be substantially located on the same plane. However, the present invention is not limited thereto.

The first surface 421a of the light transmitting member 421, and the first surface 422a of the light blocking member 422 and the first surface 423a of the planarization member 423 may be located at different heights with respect to one surface or the other surface of the light sensing layer 410. For example, the first surface 421a of the light transmitting member 421 may be located at a first height h1, and the first surface 422a of the light blocking member 422 and the first surface 423a of the planarization member 423 may be located at a second height h2. The first height h1 may be positioned higher than the second height h2 based on one surface or the other surface of the light sensing layer 410. For example, a step GP may be provided by the first surface 421a of the light transmitting member 421 and first surfaces 422a and 423a of the light blocking member 422 and the planarization member 423. Although not limited thereto, for example, the size of the step OP may be in the range of about 50 nm to about 60 nm, in the range of about 30 nm to about 80 nm, or in the range of about 10 nm to about 100 nm, Further, the light transmitting area OA and the light blocking area LSA may have different thicknesses from each other. For example, the light transmitting area OA may have a first thickness d1, and the light blocking area LSA may have second thickness d2. In this case, the first thickness d1 may be greater than the second thickness d2, and the difference between the first thickness d1 and the second thickness d2 may be substantially the same as the size of the step GP.

In a plan view, the planarization member 423 may at least partially surround the light transmitting member 421, and the light blocking member 422 may be located between the planarization member 423 and the light transmitting member 421. In this case, the light blocking member 422 may surround the light transmitting member 421, and the planarization member 423 may surround the light transmitting member 421 as well as the light blocking member 422. The light transmitting member 421 and the planarization member 423 may be spaced apart from each other and may not directly contact each other, but the present invention is not limited thereto.

The light transmitting member 421, the light blocking member 422, and the planarization member 423 may have different light transmittances from each other. The light transmittance of the light transmitting member 421 may be greater than the light transmittance of the light blocking member 422. The light transmittance of the planarization member 423 may be smaller than the light transmittance of the light transmitting member 421, and may be greater than the light transmittance of the light blocking member 422. Here, the light transmittance may refer to a degree to which external light transmits through the light transmitting member 421, the light blocking member 422, or the planarization member 423 in the thickness direction (e.g., the third direction DR3). The light transmittances of the light transmitting member 421, the light blocking member 422, and the planarization member 423 may be measured at substantially the same thickness.

Although not limited thereto, for example, the light transmittance of the light transmitting member 421 may be in a range of more than about 90% to less than about 100%, or in a range of more than about 80% to less than about 100%, The light transmittance of the light blocking member 422 may be in a range of more than about 0% to less than about 1%, or in a range of more than about 0% to less than about 10%. The light transmittance of the planarization member 423 may be in a range of more than about 50% to less than about 70%, or in a range of more than about 40% to less than about 80%.

The light transmitting member 421 may include a first organic material. The first organic material may have high light transmittance. Although not limited thereto, for example, the first organic material may include at least one of, for example, acrylic resin, epoxy resin, phenolic resin, polyamide resin, and/or polyimide resin.

The light blocking member 422 may include a second organic material and a light absorbing material. Although not limited thereto, for example, the second organic material may include at least one of, for example, acrylic resin, epoxy resin, phenolic resin, polyamide resin, and/or polyimide resin. For example, the second organic material may be substantially the same as the first organic material of the light transmitting member 421, but the present invention is not limited thereto.

Although not limited thereto, for example, the light absorbing material may include an inorganic black pigment such as carbon black or an organic black pigment. In addition, the light absorbing material may include a black dye, or may include a pigment or dye of other colors except for a black color. The light blocking member 422 may further include a negative-type photosensitive material (or, e.g., a sensitizer).

The planarization member 423 may include a third organic material and a positive-type photosensitive material (or, e.g., a sensitizer). For example, the third organic material may include at least one of acrylic resin, epoxy resin, phenolic resin, polyamide resin, and/or polyimide resin. The third organic material may be substantially the same as the first organic material of the light transmitting member 421, but the present invention is not limited thereto.

As the planarization member 423 is disposed on the light blocking member 422, the etching of the light blocking member 422 disposed in the light blocking area LSA may be minimized during the process of etching the light blocking member 422, so that the reliability of the fingerprint sensor 400 may be increased, and the contamination inside a chamber in which the etching process is performed may be minimized. Further, since the light blocking member 422 (or a material layer 422m for the light blocking member 422, refer to FIG. 10) located on the light transmitting member 421 may be more easily etched through the planarization member 423, and it may be easier to remove (or, e.g., lift off) a mask pattern (MS, refer to FIG. 8) for patterning the light transmitting member 421. In addition, it may be possible to suppress or prevent the over-etch of the light transmitting member 421, so that it is possible to further increase the reliability of the fingerprint sensor 400.

Hereinafter, a laminated structure of the display panel 100 according to an embodiment of the present invention will be described with reference to FIG. 7.

Figure 7:
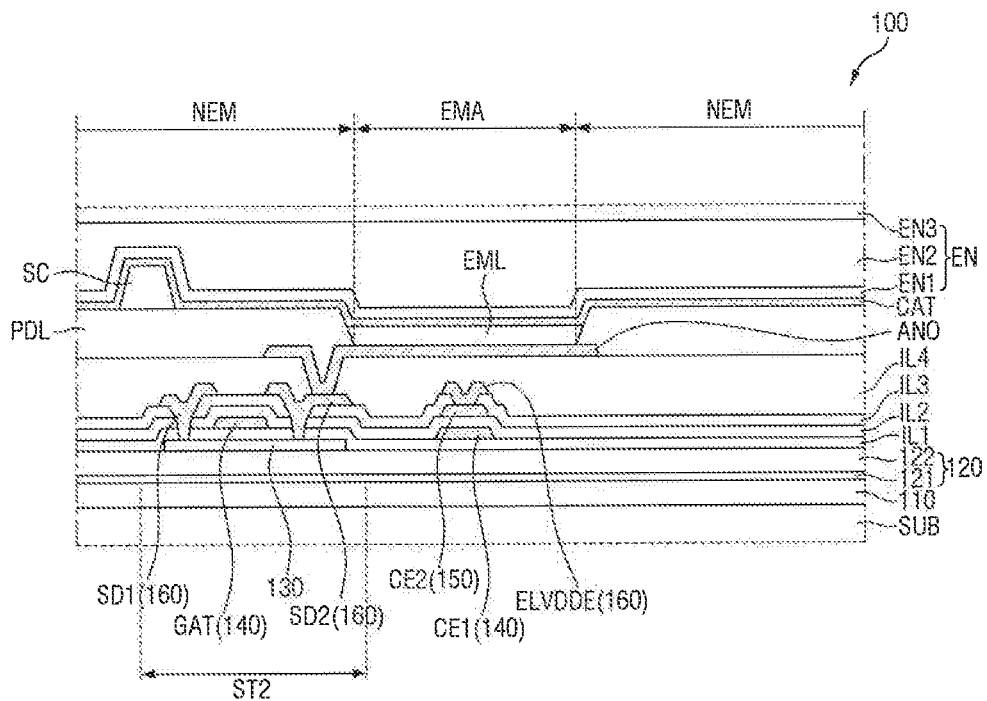
FIG. 7 is a cross-sectional view of a display panel according to an embodiment of the present invention.

FIG. 7 is a cross-sectional view of a display panel according to an embodiment of the present invention. FIG. 7 illustrates a cross-sectional structure of one pixel of the display panel 100.

Referring to FIG. 7, the display panel 100 according to an embodiment of the present invention includes a plurality of pixels, and each of the pixels may include at least one thin film transistor (e.g., a second transistor ST2). The display panel 100 may include a display base substrate SUB, a barrier layer 110, a buffer layer 120, a semiconductor layer 130, a first insulating layer IL1, a first gate conductive layer 140, a second insulating layer IL2, a second gate conductive layer 150, a third insulating layer IL3, a data conductive layer 160, a fourth insulating layer IL4, an anode electrode ANO, a pixel defining layer PDL, a light-emitting layer EML, a cathode electrode CAT disposed on the light-emitting layer EML and the pixel defining layer FDL, and a thin film encapsulation layer EN disposed on the cathode electrode CAT. The pixel defining layer PDL includes an opening exposing the anode electrode ANO, and the light-emitting layer EML is disposed in the opening of the pixel defining layer PDL. Each of the above-described layers may be formed as a single layer, but may be formed as a laminated layer including a plurality of layers. Another layer may be disposed between the respective layers.

The display base substrate SUB supports the respective layers disposed thereon. The display base substrate SUB may be made of an insulating material such as a polymer resin, or may be made of an inorganic material such as glass or quartz. However, the present invention is not limited thereto, and the display base substrate SUB may be a transparent plate or a transparent film.

For example, the display base substrate SUB may be a flexible substrate capable of bending, folding, rolling, or the like, but the present invention is not limited thereto. For example, the display base substrate SUB may be a rigid substrate.

The barrier layer 110 is disposed on the display base substrate SUB. The barrier layer 110 may prevent the diffusion of impurity ions, and may prevent the penetration of moisture or external air. In addition, the barrier layer 110 may perform a surface planarization function. For example, the barrier layer 110 may include at least one of silicon oxide (SiOx), silicon nitride (SiNx), and/or silicon oxynitride (SiOxNy). However, the present invention is not limited thereto, and the barrier layer 110 may be omitted depending on the type or process conditions of the display base substrate SUB.

The buffer layer 120 is disposed on the barrier layer 110. For example, the buffer layer 120 may include silicon nitride (SiNx), silicon oxide (SiOx), and/or silicon oxynitride (SiOxNy).

The semiconductor layer 130 is disposed on the buffer layer 120. The semiconductor layer 130 forms a channel of the second transistor ST2 of the pixel ("PX" in FIG. 3). The semiconductor layer 130 may include polycrystalline silicon. However, the present invention is not limited thereto, and for example, the semiconductor layer 130 may include at least one of single crystal silicon, low-temperature polycrystalline silicon, amorphous silicon, and/or an oxide semiconductor.

The first insulating layer IL1 is disposed on the semiconductor layer 130. The first insulating layer IL1 may be a first gate insulating layer having a gate insulating function. The first insulating layer IL1 may include at least one of a silicon compound and a metal oxide.

The first gate conductive layer 140 is disposed on the first insulating layer IL1 The first gate conductive layer 140 may include a gate electrode GAT of the second transistor ST2 of the pixel, a scan line connected thereto, and a first electrode CE1 of a storage capacitor.

The first gate conductive layer 140 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu).

The second insulating layer IL2 may be disposed on the first gate conductive layer 140. The second insulating layer IL2 may be an interlayer insulating layer or a second gate insulating layer. The second insulating layer IL2 may include an inorganic insulating material such as silicon oxide, silicon nitride, silicon oxynitride, hafnium oxide, aluminum oxide, titanium oxide, tantalum oxide, or zinc oxide.

The second gate conductive layer 150 is disposed on the second insulating layer IL2 The second gate conductive layer 150 may include a second electrode CE2 of a storage capacitor. The second gate conductive layer 150 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu). The second gate conductive layer 150 may be made of the same material as the first gate conductive layer 140, but the present invention is not limited thereto.

The third insulating layer IL3 is disposed on the second gate conductive layer 150. The third insulating layer IL3 may be an interlayer insulating layer. The third insulating layer IL3 may include an inorganic insulating material such as silicon oxide, silicon nitride, silicon oxynitride, hafnium oxide, aluminum oxide, titanium oxide, tantalum oxide, or zinc oxide. The data conductive layer 160 is disposed on the third insulating layer IL3. The data conductive layer 160 may include a first electrode SD1 and a second electrode SD2 of the second transistor ST2 of one pixel of the display panel, and a first power voltage electrode ELVDDE. The first electrode SD1 and second electrode SD2 of the second transistor ST2 may be electrically connected to a source region and a drain region of the semiconductor layer 130 through corresponding contact holes penetrating the third insulating layer IL3, the second insulating layer IL2, and the first insulating layer IL1. The first power voltage electrode ELVDDE may be electrically connected to the second electrode CE2 of the storage capacitor through a contact hole penetrating the third insulating layer IL3.

The data conductive layer 160 may include at least one of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu). The data conductive layer 160 may be a single layer or multiple layers. For example, the data conductive layer 160 may be formed as a laminated structure of Ti/Al/Ti, Mo/Al/Mo, Mo/AlGe/Mo, or Ti/Cu.

The fourth insulating layer IL4 is disposed on the data conductive layer 160. The fourth insulating layer IL4 covers the data conductive layer 160. The fourth insulating layer IL4 may be a via layer. The fourth insulating layer IL4 may include an organic insulating material. When the fourth insulating layer IL4 includes an organic material, the upper surface thereof may be substantially flat despite a lower step.

The anode electrode ANO is disposed on the fourth insulating layer IL4. The anode electrode ANO may be a pixel electrode provided for each pixel. The anode electrode ANO may be connected to the second electrode SD2 of the second transistor ST2 through a contact hole penetrating the fourth insulating layer IL4. The anode electrode ANO may at least partially overlap the light-emitting area EMA of the pixel.

The anode electrode ANO may have, but is not limited to, a laminated film structure in which a high-work-function material layer and a reflective material layer are laminated. The high-work-function material layer may include, for example, Indium—Tin—Oxide (ITO), Indium—Zinc—Oxide (IZO), Zinc Oxide (ZnO), and/or Indium Oxide ($In_2O_3$). For example, the reflective material layer may include silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof. For example, the high-work-function material layer may be disposed above the reflective material layer, and may thus be disposed closer to the light-emitting layer EML. For example, anode electrode ANO may have a multilayer structure of ITO/Mg, ITO/MgF, ITO/Ag, or ITO/Ag/ITO, but the present invention is not limited thereto.

The pixel defining layer PDL may be disposed on a portion of the anode electrode ANO. The pixel defining layer PDL may be disposed on the anode electrode ANO, and may include an opening exposing at least a portion of the anode electrode ANO. The light-emitting area EMA and the non-light-emitting area NEM may be divided by the pixel defining layer PDL and the opening thereof. The pixel defining layer PDL may include an organic insulating material. However, the present invention is not limited thereto, and the pixel defining layer PDL may include an inorganic material.

A spacer SC may be disposed on the pixel defining layer PDL. The spacer SC may serve to maintain a gap with a structure disposed thereon, Like the pixel definition layer PDL, the spacer SC may include an organic insulating material.

The light-emitting layer EML is disposed on the portion of the anode electrode ANO exposed by the pixel defining layer PDL. The light-emitting layer EML may include an organic material layer. The organic material layer of the light-emitting layer includes an organic light-emitting layer, and may further include a hole injection/transport layer and/or an electron injection/transport layer.

The cathode electrode CAT may be disposed on the light-emitting layer EML. The cathode electrode CAT may be a common electrode disposed over pixels without distinction of the pixels. For example, the cathode electrode CAT may be entirely disposed over the pixels. The anode electrode ANO, the light-emitting layer EML, and the cathode electrode CAT may each constitute an organic light-emitting element.

The cathode electrode CAT may include a low-work-function material layer including, for example, Li, Ca, LiF/Ca, LiF/Al, Al, Mg, Ag, Pt, Pd, Ni, Nd, Ir, Cr, BaF, Ba, or a compound or mixture thereof (for example, a mixture of Ag and Mg). The cathode electrode CAT may further include a transparent metal oxide layer disposed on the low-work-function material layer.

A thin film encapsulation layer EN including a first inorganic layer EN1, a first organic layer EN2, and a second inorganic layer EN3 is disposed on the cathode electrode CAT. For example, at an end of the thin film encapsulation layer EN, the first inorganic layer EN1 and the second inorganic layer EN3 may contact each other. For example, first organic layer EN2 may be sealed by the first inorganic layer EN1 and the second inorganic layer EN3.

Each of the first inorganic layer EN1 and the second inorganic layer EN3 may include, for example, silicon nitride, silicon oxide, or silicon oxynitride. The first organic layer EN2 may include an organic insulating material.

Hereinafter, a method of manufacturing the display device 10 according to an embodiment of the present invention will be described.

FIGS. 8 to 12 are cross-sectional views illustrating a method of manufacturing a display device according to an embodiment of the present invention. FIGS. 8 to 12 are cross-sectional views for each manufacturing process illustrating an optical layer 420 of the fingerprint sensor 400 of the display device 10 according to an embodiment of the present invention.

Figure 8:
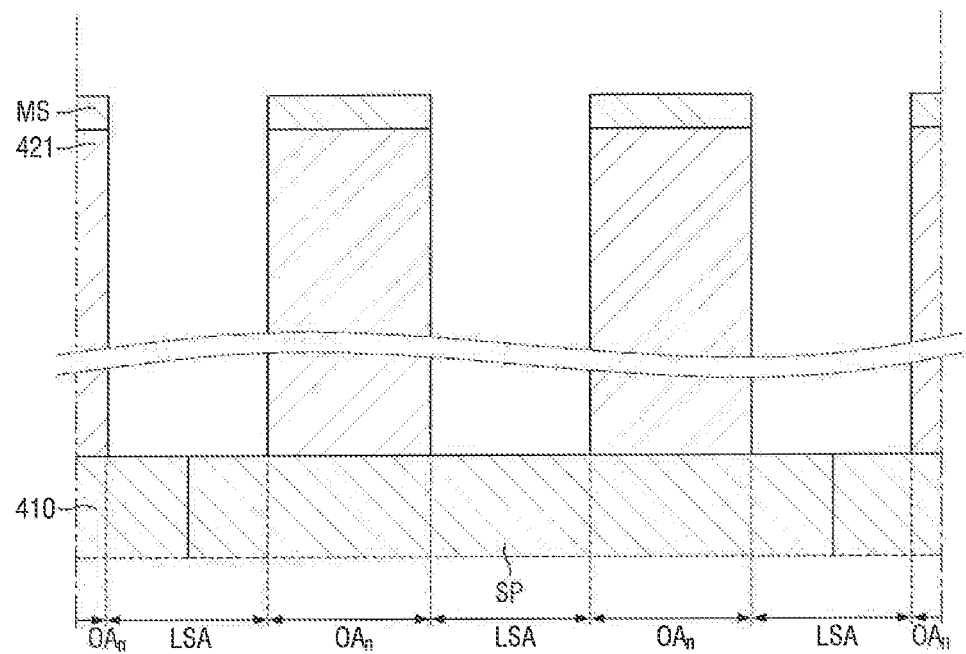
FIGS. 8, 9, 10, 11 and 12 are cross-sectional views illustrating a method of manufacturing a display device according to an embodiment of the present invention.

First, referring to FIG. 8, a light transmitting member material layer is formed on the light sensing layer 410, and is etched using a mask pattern MS to form a light transmitting member 421. For example, the light transmitting member material layer is formed on the entire upper surface of the light sensing layer 410.

For example, a light transmitting member material layer may be formed over the entire area of the light sensing layer 410. The light transmitting member material layer may include substantially the same material as the aforementioned light transmitting member 421. Thereafter, a mask pattern MS is patterned on the light transmitting member material layer. The mask pattern MS may include substantially the same planar pattern as the light transmitting member 421, and a plurality of mask patterns may be provided. The mask pattern MS may include at least one of a transparent conductive oxide (TCO) and/or an inorganic layer. Although not limited thereto, for example, the transparent conductive oxide (TCO) may include at least one of indium tin oxide (ITO) and/or indium zinc oxide (IZO), and the inorganic layer includes aluminum (Al) or the like.

The light transmitting member material layer may be patterned by etching the light transmitting member material layer using the patterned mask pattern MS as an etching mask to form the light transmitting member 421. For example, the process of etching the light transmitting member material layer may be performed by dry etching, but the present invention is not limited thereto, and the process thereof may also be performed by wet etching. A part of the first light transmitting member material layer in a portion not covered by the mask pattern MS may be removed, and only a portion covered by the mask pattern MS may remain.

Figure 9:
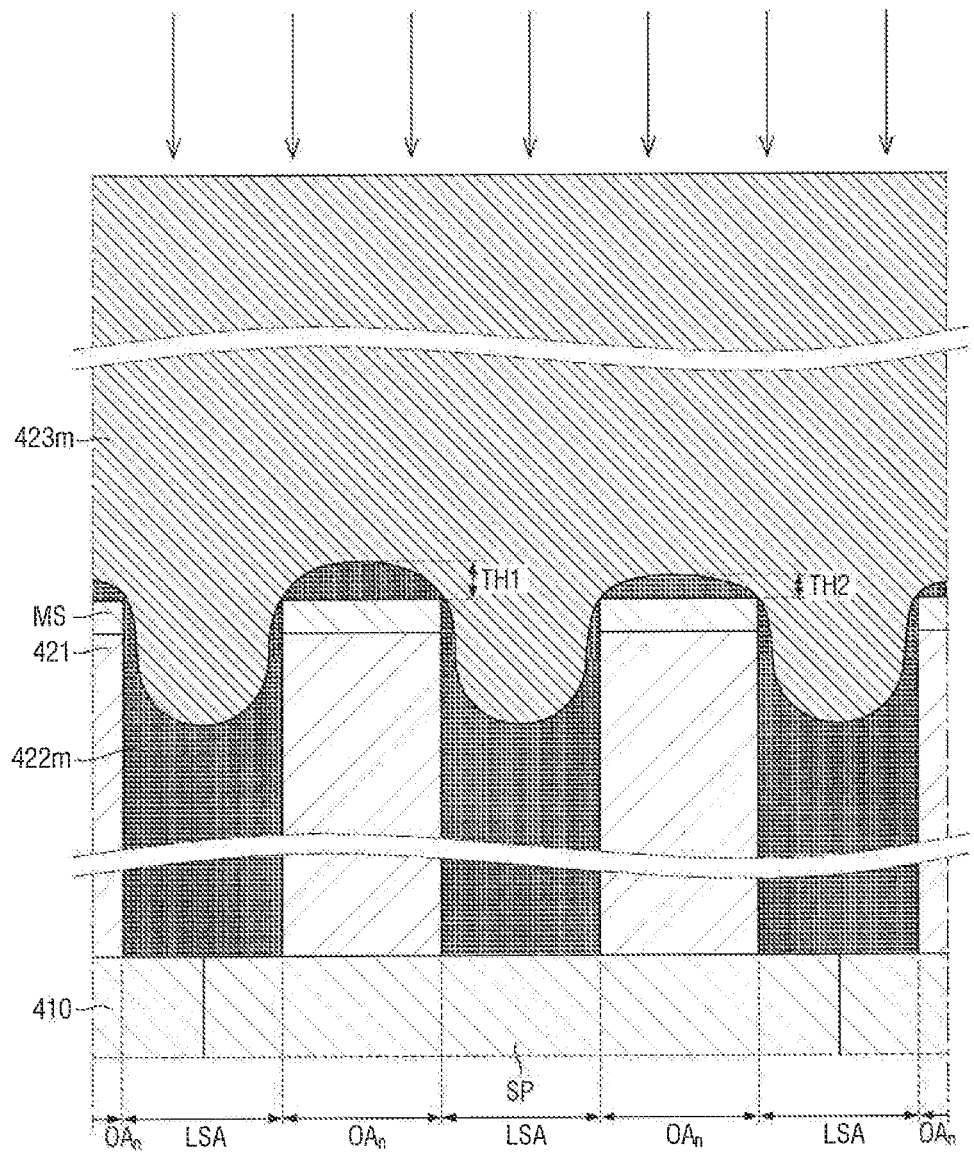

Subsequently, referring to FIG. 9, a light blocking member material layer 422m, is formed on the light sensing layer 140 on which the light transmitting member 421 is disposed, and a planarization member material layer 423m is formed on the light blocking member material layer 422m.

For example, a light blocking member material layer 422m is formed on the light sensing layer 410 on which the first light transmitting member material layer 421m is disposed. The light blocking member material layer 422m may include substantially the same material as the above-described light blocking member 422. The light blocking member material layer 422m may cover the light transmitting member 421 and the mask pattern MS, and may be formed over the light sensing layer 410. For example, the light blocking member material layer 422m may be formed over the entire area of the light sensing layer 410. For example, the light blocking member material layer 422m may cover the entire area of the side surface of the light transmitting member 421. The light blocking member material layer 422m may cover the side surface and upper surface of the mask pattern MS.

The thicknesses of the light blocking member material layer 422m disposed on the upper surface of each mask pattern MS may be different from each other. For example, the first thickness TH1 of the light blocking member material layer 422m disposed on the upper surface of one mask pattern MS may be larger than the second thickness TH2 of the light blocking member material layer 422m disposed on the upper surface of another mask pattern MS adjacent to the one mask pattern MS.

A planarization member material layer 423m may be disposed on the light blocking member material layer 422m. For example, the planarization member material layer 423m may be disposed over the entire area of the light blocking member material layer 422m. The light blocking member material layer 422m may be provided with a step between the upper surface of a portion thereof disposed in the unit light transmitting area OAn and the upper surface of a portion thereof disposed in the light blocking area LSA and between the upper surfaces of portions thereof disposed in the unit light transmitting areas OAn. In this case, since the planarization member material layer 423m may be disposed on the light transmitting member 421, the mask pattern MS and the light blocking member 422m, the step may be compensated, and the upper surface of the planarization member material layer 423m may be substantially flat.

The planarization member material layer 423m may include substantially the same material as the above-described planarization member 423. Although not limited thereto, the thickness of the planarization member material layer 423m may be, for example, in the range of about 5 μm to about 15 μM or in the range of about 1 μm to about 20 μm. Here, the thickness of the planarization member material layer 423m may refer to an average thickness of the entire area of the planarization member material layer 423m.

After the light blocking member material layer 422m and the planarization member material layer 423m are formed, the entire area of the planarization member material layer 423m is exposed. For example, an upper surface of the planarization member material layer 423m may be exposed.

Figure 10:
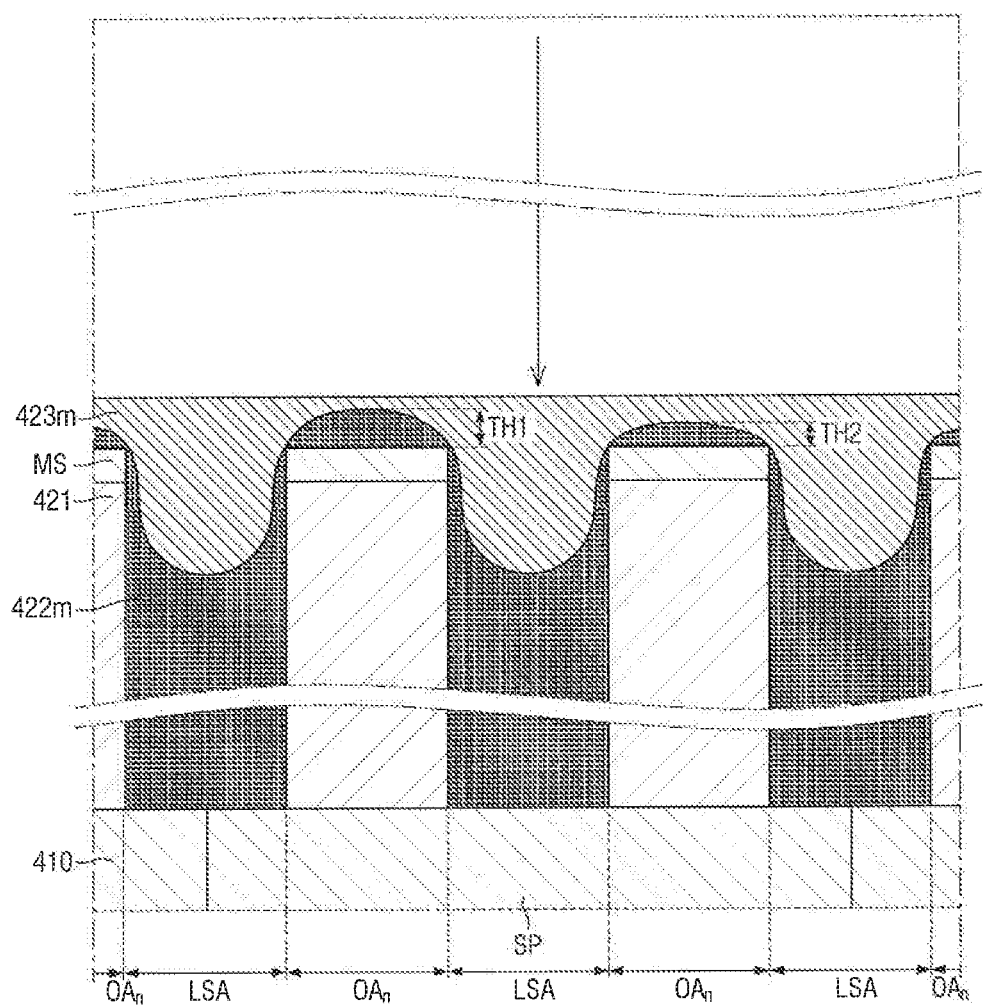

Subsequently, referring to FIG. 10, the exposed planarization member material layer 423m may be developed, thereby reducing the thickness of the planarization member material layer 423m.

For example, the planarization member material layer 423m may include a positive-type photosensitive material, and in this case, the exposed portion thereof does not maintain a cured state and has a property of being soluble in a developer. Accordingly, the thickness of the planarization member material layer 423m may be reduced by developing the exposed portion through a developer. After the development, the remaining portion may be cured.

Figure 11:
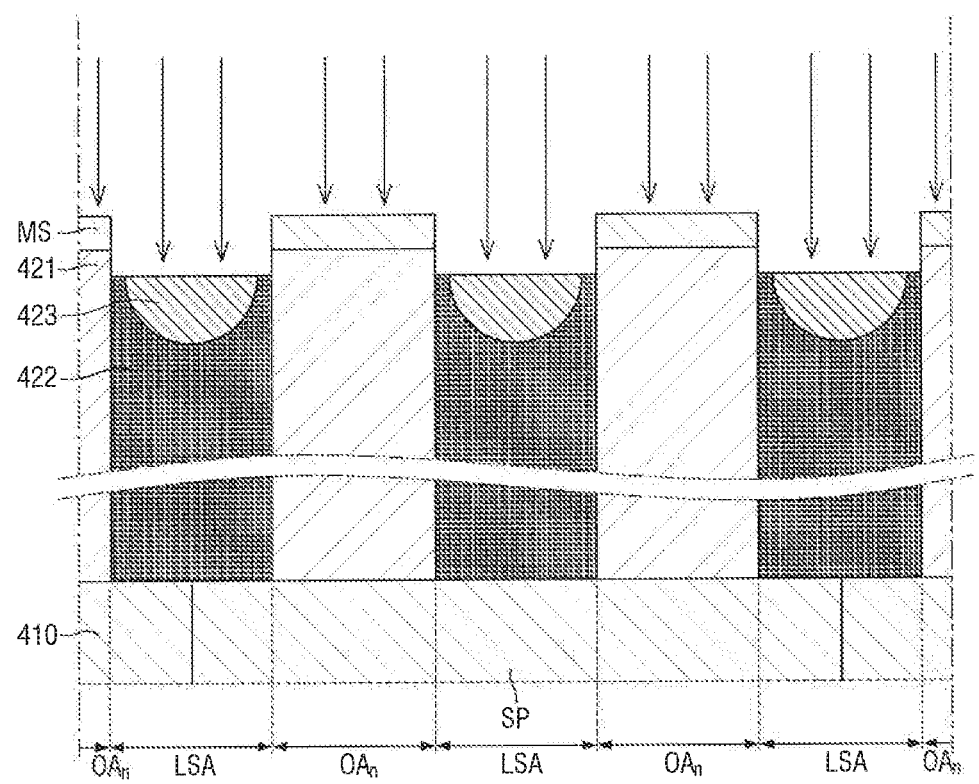

Subsequently, referring to FIG. 11, the light blocking member material layer 422m and the planarization member material layer 423m remaining after the development are etched to form a light blocking member 422 and a planarization layer 423.

For example, the light blocking member material layer 422m and the planarization member material layer 423m remaining after the development are etched to pattern the remaining light blocking member material layer 422m and the remaining planarization member material layer 423m to form the light blocking member 422 and the planarization layer 423. For example, the process of etching the light blocking member material layer 422m and the planarization member material layer 423m remaining after the development to form the light blocking member 422 and the planarization layer 423 may be performed by dry etching, but the present invention is not limited thereto.

Through the etching process, the height of one surface of the light blocking member 422 is substantially the same as the neigh of one surface of the planarization member 423, and the upper surface 422a (refer to FIG. 6) of the light blocking member 422 may be exposed. For example, an upper surface of the light blocking member 422 and an upper surface of the planarization member 423 may be coplanar. Further, the height of one surface of the light blocking member 422 and the height of one surface of the planarization member 423 may be located at a height lower than the height of one surface of the light transmitting member 421.

As the planarization member material layer 423m is disposed on the light blocking member material layer 422m, even if the thickness of the light blocking member material layer 422m disposed on each mask pattern MS is different, the light blocking member material layer 422m disposed on each mask pattern. MS may be removed simultaneously from each mask pattern MS. For example, as the planarization member material layer 423m is disposed on the light blocking member material layer 422m, the thicknesses of the organic layers disposed on each mask pattern MS may be substantially the same as each other.

Both the light blocking member material layer 422m and the planarization member material layer 423m may each include an organic material, and in this case, the degree to which both material layers are etched may be substantially the same. The light blocking member material layer 422m and the planarization member material layer 423m remaining after development can be etched at the same time, and accordingly, the light blocking member material layer 422m disposed on each mask pattern MS may be removed simultaneously from each mask pattern MS even if the thickness of the light blocking member material layer 422m disposed on each mask pattern MS is different. Accordingly, it is possible to suppress or prevent the light blocking member material layer 422m from remaining on the mask pattern MS, and thereafter, the removal of the mask pattern MS may be easier.

Further, over-etching for removing all the light blocking member material layers 422m disposed on each mask pattern MS and having different thicknesses may be unnecessary. Accordingly, damage to the light transmitting member 421 due to over-etching of the light blocking member material layer 422m can be suppressed or prevented, and further, deterioration in reliability of the fingerprint sensor 400 can be suppressed or prevented.

In addition, as the light blocking member material layer 422m is covered by the planarization member material layer 423m, the upper surface of the light blocking member 422 and the upper surface of the planarization member 423 may be substantially flat, and etching of the light blocking member material layer 422m disposed in the light blocking area LSA may be minimized. Therefore, since an additional configuration for planarization may be unnecessary, the manufacturing process may be simplified, the process cost may be reduced, and the contamination inside a chamber in which the etching process is performed may be minimized.

Figure 12:
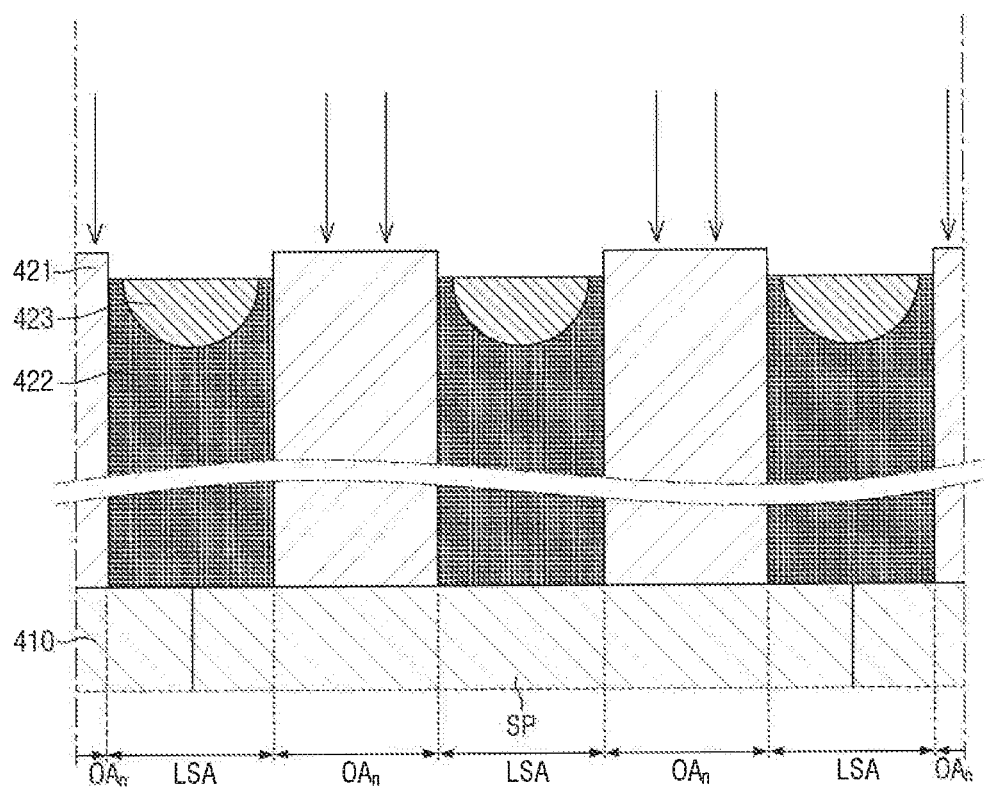

Subsequently, referring to FIG. 12, after the light blocking member 422 and the planarization member 423 are formed, the mask pattern MS is removed. The mask pattern MS may be removed through wet etching, but the present invention is not limited thereto.

Even if the thickness of the light blocking member material layer 422m disposed on each mask pattern MS is different, as the planarization member material layer 423m is further disposed, the light blocking member material layer 422m disposed on each mask pattern MS may be removed simultaneously. Accordingly, each mask pattern MS may be exposed without being covered by the light blocking member material layer 422m, and may be easily removed by the wet etching. As the mask pattern MS is easily removed, reliability of the fingerprint sensor 400 may be increased.

Hereinafter, embodiments of the display device will be described. In the following embodiments, descriptions of the same components as those of the previously described embodiments will be omitted or simplified, and differences will be mainly described.

Figure 13:
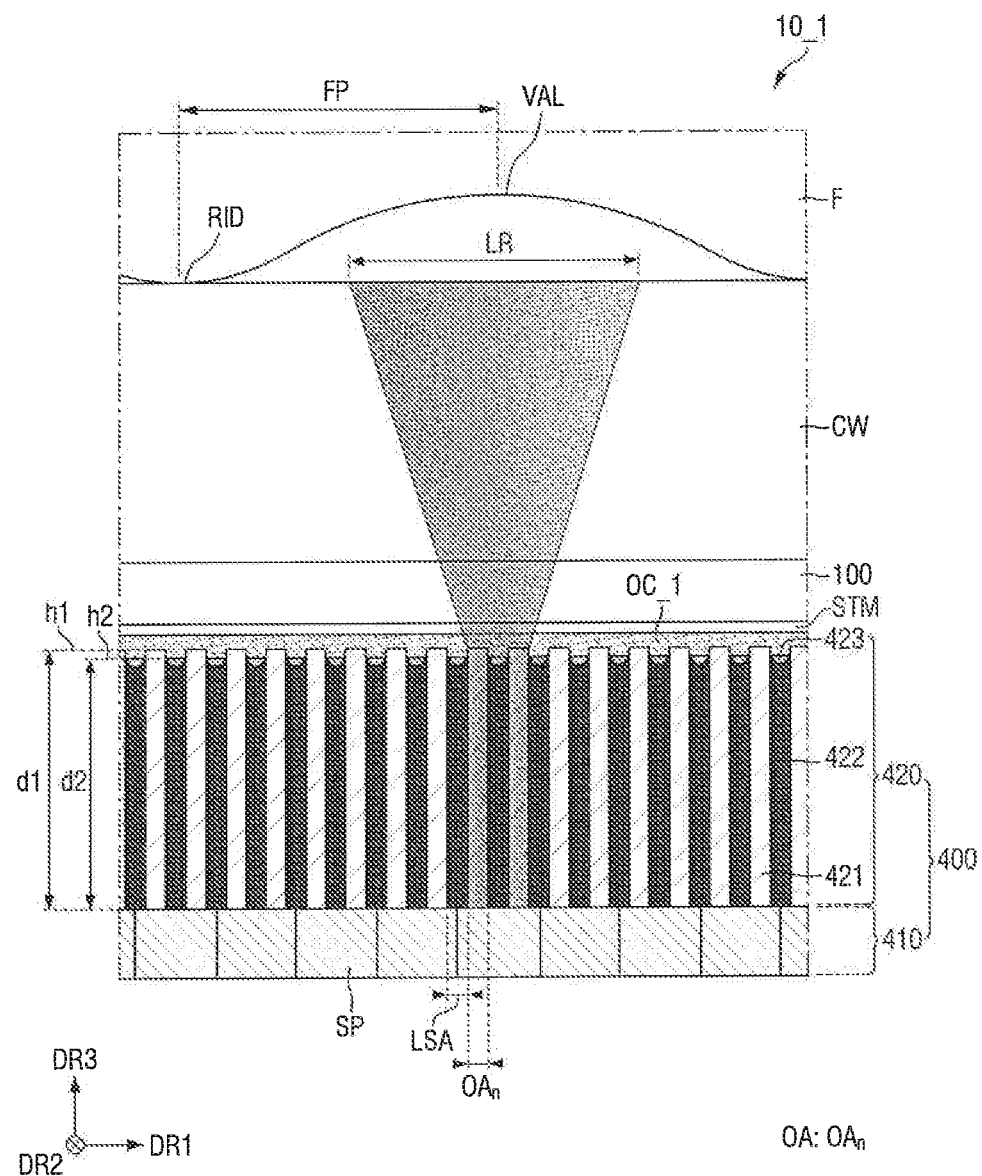
FIG. 13 is a cross-sectional view of a display device according to an embodiment of the present invention.

FIG. 13 is a cross-sectional view of a display device according to an embodiment of the present invention.

Referring to FIG. 13, a display device 10_1 according to the present embodiment is different from the display device 10 of the embodiment of FIG. 4 in that it further includes an overcoat layer OC_1. The overcoat layer OC_1 according to the present embodiment may cover the light transmitting member 421, the light blocking member 422, and the planarization member 423, and may overlap the light sensing layer 410. For example, the overcoat layer OC_1 may overlap the entire upper surface of the light sensing layer 410. The adhesive member STM may be disposed on the overcoat layer OC_1, Although not limited thereto, the overcoat layer OC_1 may include an organic material, but may also include an inorganic material.

Even in this case, the light blocking member material layer 422m (refer to FIG. 10) disposed on the mask pattern MS (refer to FIG. 11) may be easily etched, the mask pattern MS (refer to FIG. 11) may be easily removed, damage to the light transmitting member 421 may be prevented, and etching of the light blocking member 422 in the light blocking area LSA may be minimized. In addition, as the overcoat layer OC_1 covers the light transmitting member 421, the light Mocking member 422, and the planarization member 423, the upper portions of the light transmitting member 421, the light blocking member 422, and the planarization member 423 may be flattened, and may be more easily attached to the display panel 100.

Figure 14:
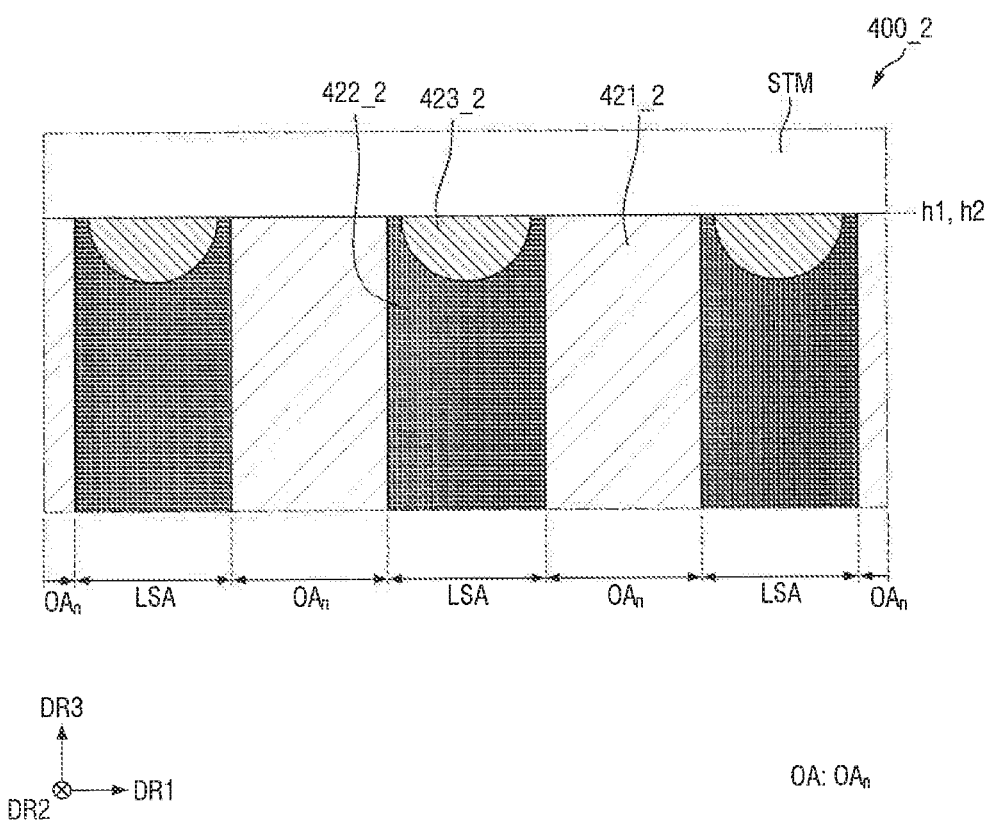
FIG. 14 is a cross-sectional view of a fingerprint sensor of a display device according to an embodiment of the present invention.

FIG. 14 is a cross-sectional view of a fingerprint sensor of a display device according to an embodiment of the present invention.

Referring to FIG. 14, a fingerprint sensor 400_2 according to the present embodiment is different from the fingerprint sensor 400 of the embodiment of FIG. 5 in that the height h1 of one surface of a light transmitting member 421_2 of the fingerprint sensor 400_2 is substantially the same as the height h2 of one surface of each of a light blocking member 422_2 and planarization member 423_2 of the fingerprint sensor 400_2. For example, the heights h1 and h2 of the light transmitting member 421_2, the light blocking member 422_2, and the planarization member 423_2 of the fingerprint sensor 400_2 may be located at the same height with respect to one surface or the other surface of the light sensing layer 410 (refer to FIG. 4), and may be located on substantially the same plane. For example, the upper surfaces of the light transmitting member 421_2, the light blocking member 422_2 and the planarization member 423_2 may be coplanar.

Even in this case, the light blocking member material layer 422m (refer to FIG. 10) disposed on the mask pattern MS (refer to FIG. 11) may be easily etched, the mask pattern MS (refer to FIG. 11) may be easily removed, damage to the light transmitting member 421 may be prevented, and etching of the light blocking member 422 in the light blocking area LSA may be minimized In addition, as the heights h1 and h2 of the light transmitting member 421_2, the light blocking member 422_2, and the planarization member 423_2 of the fingerprint sensor 400_2 are located at the same height, the upper portion of the fingerprint sensor 400_2 may be substantially flat, and may be more easily attached to the display panel 100.

Figure 15:
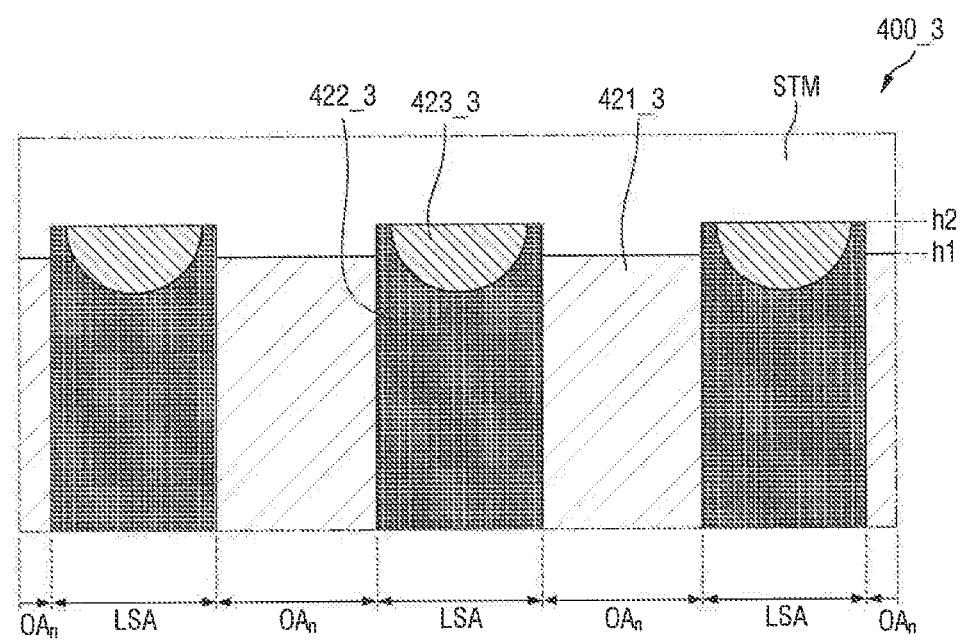
FIG. 15 is a cross-sectional view of a fingerprint sensor of a display device according to an embodiment of the present invention.

FIG. 15 is a cross-sectional view of a fingerprint sensor of a display device according to an embodiment of the present invention.

Referring to FIG. 15, a fingerprint sensor 400_3 according to the present embodiment is different from the fingerprint sensor 400 of the embodiment of FIG. 5 in that the height h1 of one surface of a light transmitting member 421_3 of the fingerprint sensor 400_3 is located at a height lower than the height h2 of one surface of each of a light blocking member 422_3 and planarization member 423_3 of the fingerprint sensor 400_3 with respect to one surface or the other surface of the light sensing layer 410 (refer to FIG. 4).

Even in this case, the light blocking member material layer 422m (refer to FIG. 10) disposed on the mask pattern MS (refer to FIG. 11) may be easily etched, the mask pattern MS (refer to FIG. 11) may be easily removed, damage to the light transmitting member 421 may be prevented, and etching of the light blocking member 422 in the light blocking area LSA may be minimized. In addition, as the height h2 of one surface of each of the light blocking member 422_3 and planarization member 423_3 of the fingerprint sensor 400_3 is located at a height higher than the height h1 of one surface of the light transmitting member 421_3 of the fingerprint sensor 400_3, the light blocking area LSA may more easily block external light from entering the light transmitting member 421_3, and reliability of fingerprint sensing may be increased.

Figure 16:
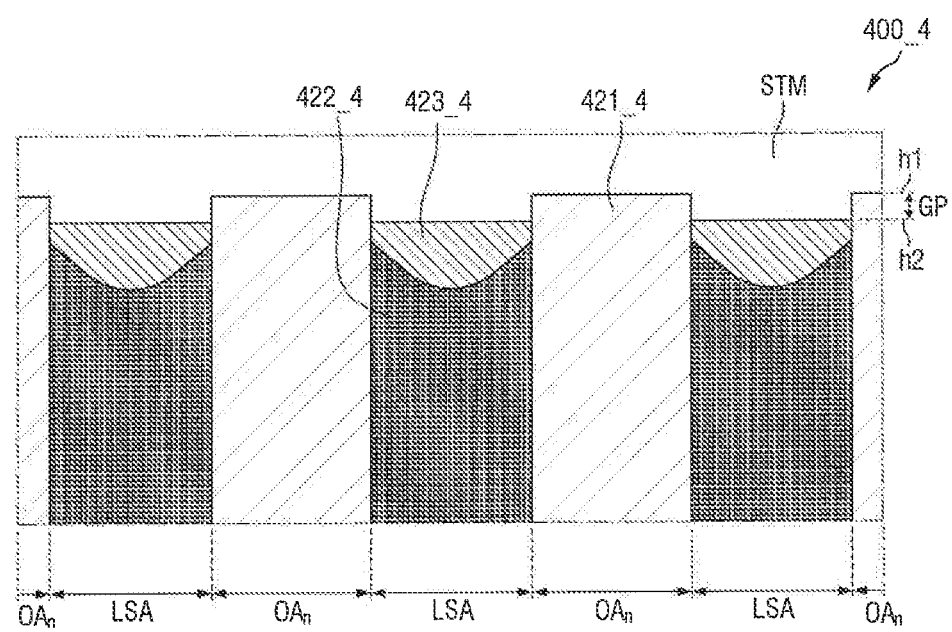
FIG. 16 is a cross-sectional view of a fingerprint sensor of a display device according to an embodiment of the present invention.

FIG. 16 is a cross-sectional view of a fingerprint sensor of a display device according to an embodiment of the present invention.

Referring to FIG. 16, a fingerprint sensor 400_4 according to the present embodiment is different from the fingerprint sensor 400 of the embodiment of FIG. 5 in that a planarization member 423_4 of the fingerprint sensor 400_4 covers a light blocking member 422_4. For example, the planarization member 423_4 may completely cover the upper surfaces of the light blocking member 422_4. In other words, the planarization member 423_4 may be formed in substantially the same pattern as the light blocking member 422_4 in a plan view, and the planarization member 423_4 may overlap the light blocking member 422_4 in the thickness direction. For example, the light blocking member 422_4 and the planarization member 423_4 may completely overlap each other in the thickness direction. Accordingly, the entire area of the light blocking member 422_4 may be covered by the planarization member 423_4, and may not be exposed.

Even in this case, the light blocking member material layer 422m (refer to FIG. 10) disposed on the mask pattern MS (refer to FIG. 11) may be easily etched, the mask pattern MS (refer to FIG. 11) may be easily removed, damage to the light transmitting member 421_4 may be prevented, and etching of the light blocking member 422_4 in the light blocking area LSA may be minimized. In addition, the light blocking member 422_4 and the planarization member 423_4 may be configured to have various arrangements, so that the arrangement of the components may be changed as desired.

While the present invention has been described with reference to the exemplary embodiments thereof; it will be understood by those of ordinary skill in the art that various changes in form and detail may be made thereto without departing from the spirit and scope of the present invention.

What is claimed is:

1. A fingerprint sensor, comprising:
a light sensing layer including a light sensing element; and
an optical layer including a plurality of light transmitting areas, a light blocking area, a light transmitting member disposed in the plurality of light transmitting areas, a light blocking member disposed in the light blocking area, and a planarization member disposed on the light blocking member, wherein the light blocking area surrounds the plurality of light transmitting areas,
wherein the light transmitting member includes a first organic material, wherein the light blocking member includes a second organic material, and wherein the planarization member includes a third organic material and a positive-type photosensitive material.

2. The fingerprint sensor of claim 1,
wherein the planarization member overlaps the light blocking member in a thickness direction, and exposes a portion of the light blocking member.

3. The fingerprint sensor of claim 2,
wherein the portion of the light blocking member exposed by the planarization member is disposed between the light transmitting member and the planarization member.

4. The fingerprint sensor of claim 3,
wherein the light blocking member at least partially surrounds the light transmitting member.

5. The fingerprint sensor of claim 1,
wherein the light blocking member further includes a recess, and the planarization member is disposed on the recess.

6. The fingerprint sensor of claim 5,
wherein the planarization member exposes a portion of the light blocking member, and
a first surface of the planarization member and a first surface of the portion of the light blocking member exposed by the planarization member are located at the same first height with respect to a first surface of the light sensing layer.

7. The fingerprint sensor of claim 6,
wherein a first surface of the light transmitting member is located at a second height higher than the first height with respect to the first surface of the light sensing layer.

8. The fingerprint sensor of claim 1,
wherein light transmittance of the light transmitting member is greater than light transmittance of the planarization member, and light transmittance of the planarization member is greater than light transmittance of the light blocking member.

9. The fingerprint sensor of claim 8,
wherein the light transmittance of the light transmitting member is in a range between about 90% and about 100%, wherein the light transmittance of the planarization member is in a range between about 50% and about 70%, and wherein the light transmittance of the light blocking member is in a range between about 0% and about 10%.

10. The fingerprint sensor of claim 1,
wherein the light blocking member further includes a black pigment or dye.

11. A display device, comprising:
a display panel; and
a fingerprint sensor disposed on the display panel,
wherein the fingerprint sensor includes:
a light sensing layer including a light sensing element; and
an optical layer including a plurality of light transmitting areas, a light blocking area, a light transmitting member disposed in the plurality of light transmitting areas, a light blocking member disposed in the light blocking area, and a planarization member disposed on the light blocking member, wherein the light blocking area surrounds the plurality of light transmitting areas,
wherein light transmittance of the light transmitting member is greater than light transmittance of the planarization member, and light transmittance of the planarization member is greater than light transmittance of the light blocking member, and
wherein the planarization member overlaps the light blocking member in a thickness direction, and exposes a portion of the light blocking member.

12. The display device of claim 11,
wherein the portion of the light blocking member exposed by the planarization member is disposed between the light transmitting member and the planarization member, and surrounds the light transmitting member.

13. The display device of claim 11,
wherein a first surface of the planarization member and a first surface of the portion of the light blocking member exposed by the planarization member are located at the same height with respect to a first surface of the light sensing layer.

14. The display device of claim 11,
wherein the light transmitting member includes a first organic material, wherein the light blocking member includes a second organic material, and wherein the planarization member includes a third organic material and a positive-type photosensitive material.

15. The display device of claim 11,
wherein the light blocking member includes a recess, and the planarization member is disposed on the recess.

* * * * *